(12) United States Patent
Nagai et al.

(10) Patent No.: US 10,541,241 B2
(45) Date of Patent: Jan. 21, 2020

(54) SEMICONDUCTOR DEVICE HAVING THYRISTOR AND METAL-OXIDE SEMICONDUCTOR TRANSISTOR

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yukihiro Nagai, Saijo (JP); Le-Tien Jung, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/158,321

(22) Filed: Oct. 12, 2018

(65) Prior Publication Data

US 2019/0043863 A1    Feb. 7, 2019

Related U.S. Application Data

(62) Division of application No. 15/493,150, filed on Apr. 21, 2017, now Pat. No. 10,134,736.

(30) Foreign Application Priority Data

Mar. 24, 2017    (CN) .......................... 2017 1 0180530

(51) Int. Cl.
*H01L 27/102* (2006.01)
*H01L 29/06* (2006.01)
(Continued)

(52) U.S. Cl.
CPC .... *H01L 27/1027* (2013.01); *H01L 21/76224* (2013.01); *H01L 21/76895* (2013.01);
(Continued)

(58) Field of Classification Search
CPC .......... H01L 27/1027; H01L 29/66553; H01L 29/66378; H01L 29/0649; H01L 29/87;
(Continued)

(56) References Cited

U.S. PATENT DOCUMENTS 7,456,439 B1 * 11/2008 Horch ..................... G11C 11/39
257/133
7,893,456 B1    2/2011 Nemati et al.
(Continued)

FOREIGN PATENT DOCUMENTS

CN    102782848 A    11/2012
JP    2002-261248 A    9/2002

OTHER PUBLICATIONS

Kilopass Technology, Title: A Novel Bulk Vertical Layer Thyristor Cell for DRAM APplications, MemCon—Oct. 11, 2016.
(Continued)

*Primary Examiner* — Steven H Loke
*Assistant Examiner* — Juanita B Rhodes
(74) *Attorney, Agent, or Firm* — Winston Hsu

(57) ABSTRACT

A semiconductor device includes a substrate having a cell region and a peripheral region, a thyristor on the cell region, a MOS transistor on the peripheral region, and a first silicide layer on the substrate adjacent to the thyristor on the cell region. Preferably, the thyristor includes: a first semiconductor layer, a second semiconductor layer, a third semiconductor layer, and a fourth semiconductor layer on the cell region, vertical dielectric patterns in the first semiconductor layer, the second semiconductor layer, the third semiconductor layer, and the fourth semiconductor layer, and first contact plugs on the fourth semiconductor layer.

11 Claims, 5 Drawing Sheets

(51) Int. Cl.
  *H01L 23/535* (2006.01)
  *H01L 29/87* (2006.01)
  *H01L 21/762* (2006.01)
  *H01L 21/768* (2006.01)
  *H01L 29/66* (2006.01)

(52) U.S. Cl.
  CPC ........ *H01L 23/535* (2013.01); *H01L 29/0649* (2013.01); *H01L 29/66378* (2013.01); *H01L 29/66553* (2013.01); *H01L 29/87* (2013.01)

(58) Field of Classification Search
  CPC ......... H01L 21/76895; H01L 21/76224; H01L 23/535; H01L 27/11; H01L 27/1104
  See application file for complete search history.

(56) References Cited

U.S. PATENT DOCUMENTS

| | | |
|---|---|---|
| 8,093,107 B1 | 1/2012 | Nemati |
| 8,288,795 B2 | 10/2012 | Tang |
| 9,496,021 B2 | 11/2016 | Luan et al. |
| 2001/0024841 A1* | 9/2001 | Noble, Jr. ............ G11C 11/4113 438/138 |
| 2007/0057328 A1* | 3/2007 | Taniguchi ....... H01L 21/823814 257/368 |
| 2012/0037953 A1 | 2/2012 | Hayano |
| 2012/0228629 A1 | 9/2012 | Nemati |
| 2013/0314986 A1 | 11/2013 | Nemati |
| 2016/0093358 A1 | 3/2016 | Luan et al. |
| 2016/0093622 A1 | 3/2016 | Luan et al. |
| 2016/0093624 A1 | 3/2016 | Luan et al. |
| 2017/0229465 A1* | 8/2017 | Luan ................. H01L 21/28518 |

OTHER PUBLICATIONS

Farid Nemati, Title: Thyristor RAM (T-RAM): A High-Speed High-Density Embedded Memory Technology for Nano-scale CMOS, 2007 Hot Chips Conference, Aug. 21, 2007.

Sinha, Title: A Novel Capacitorless DRAM Cell Design using Band-gap Engineered Junctionless Double-gate FET, 2016.

* cited by examiner

US 10,541,241 B2

SEMICONDUCTOR DEVICE HAVING THYRISTOR AND METAL-OXIDE SEMICONDUCTOR TRANSISTOR

CROSS REFERENCE TO RELATED APPLICATIONS

This application is a division of U.S. application Ser. No. 15/493,150 filed Apr. 21, 2017, and incorporated herein by reference in its entirety.

BACKGROUND OF THE INVENTION

1. Field of the Invention

The invention relates to a method for fabricating semiconductor device, and more particularly, to a method of integrating thyristor and metal-oxide semiconductor (MOS) transistor on a semiconductor substrate.

2. Description of the Prior Art

Thyristors are switching applications having four layers, $P_1$-$N_1$-$P_2$-$N_2$ and three P-N junctions in series. An electrode defined as an anode is coupled to the external $P_1$ layer. An electrode defined as a cathode is coupled to the external $N_2$ layer. A gate electrode is coupled to the middle $P_2$ layer. A thyristor having this structure commonly referred to as a silicon-controlled rectifier (SCR).

A characteristic of the thyristor is that the middle junction is reverse biased when positive voltage is applied to the anode and passive voltage is applied to the cathode, so there is no electrical current passing through the thyristor. However, when the positive voltage is applied to the gate, the thyristor enters a breakdown and the voltage of breakdown is referred to as the breakover voltage. When breakover voltage is reached, electrical current crosses the junction from the cathode to the anode and such electrical current is typically referred to as a holding current. When the thyristor is in a breakdown, the gate is not controlled by the thyristor and the electrical current is maintained until the circuit breaks off or the voltage becomes zero, and then electrical current stops. Therefore, the thyristor has a characteristic of holding voltage.

Thyristors are also bipolar devices having characteristics of bistable and negative differential resistance (NDR) and are widely applied in static random access memories (SRAMs). The memory having thyristors are often referred to as T-RAM.

Conventional T-RAM includes a vertical thyristor and a metal oxide semiconductor (MOS). The vertical thyristor is a thyristor having a structure of $P_1$-$N_1$-$P_2$-$N_2$ stacked from bottom to top. Even though current T-RAM has advantages of stable electrical current and higher thermal stability, it has been difficult to integrate T-RAM with MOS transistors as the formation of vertical thyristors typically require numerous polysilicon deposition processes. Consequently, more complicated processes are needed to complete the fabrication of these thyristors. Hence how to improve the current thyristor design while integrating these elements with device such as MOS transistors has become an important task in this field.

SUMMARY OF THE INVENTION

According to an embodiment of the present invention, a method for fabricating a semiconductor device includes the steps of: providing a substrate having a cell region and a peripheral region; forming a first semiconductor layer, a second semiconductor layer, a third semiconductor layer, and a fourth semiconductor layer on the substrate; forming a thyristor on the cell region; removing the first semiconductor layer, the second semiconductor layer, the third semiconductor layer, and the fourth semiconductor layer on the peripheral region; and forming a metal oxide semiconductor (MOS) transistor on the peripheral region.

According to another aspect of the present invention, a semiconductor device includes: a substrate having a cell region and a peripheral region; a thyristor on the cell region; a MOS transistor on the peripheral region; a first shallow trench isolation (STI) between the thyristor and the MOS transistor; and a second STI between the first STI and the MOS transistor.

According to another aspect of the present invention, a semiconductor device includes: a substrate having a cell region and a peripheral region; a thyristor on the cell region; a MOS transistor on the peripheral region; and a first silicide layer on the substrate adjacent to the thyristor on the cell region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
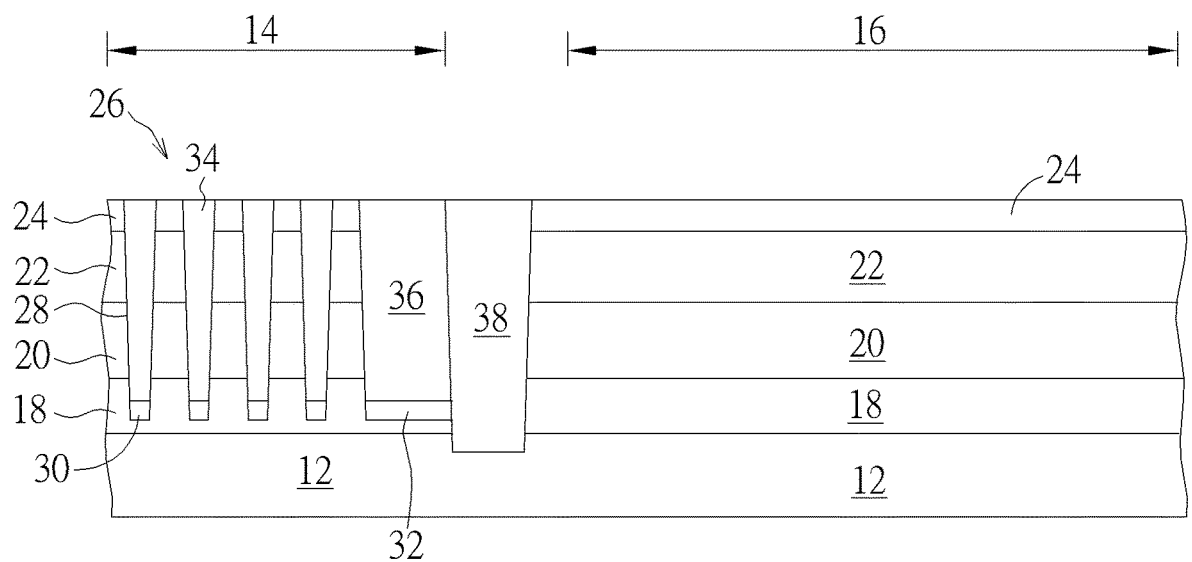
FIGS. 1-4 illustrate a method for fabricating a semiconductor device according to a first embodiment of the present invention.

Referring to FIGS. 1-4, FIGS. 1-4 illustrate a method for fabricating a semiconductor device according to a first embodiment of the present invention. As shown in FIG. 1, a substrate 12 such as a semiconductor substrate made of silicon is provided, and a memory cell or cell region 14 and a peripheral region 16 are defined on the substrate 12. Next, a first semiconductor layer 18, a second semiconductor layer 20, a third semiconductor layer 22, and a fourth semiconductor layer 24 are formed on the substrate 12 on the cell region 14 and the peripheral region 16.

In this embodiment, a stacked structure constituting the first semiconductor layer 18, the second semiconductor layer 20, the third semiconductor layer 22, and the fourth semiconductor layer 24 is preferably formed by stacking four layers of n-type and p-type semiconductor layers alternately, in which the first semiconductor layer 18 and the third semiconductor layer 22 preferably share same conductive type while the substrate 12, the second semiconductor layer 20, and the fourth semiconductor layer 24 share same conductive type. For instance, the first semiconductor layer 18 and the third semiconductor layer 22 in this embodiment are n-type semiconductor layers while the substrate 12, the second semiconductor layer 20, and the fourth semiconductor layer 24 are p-type semiconductor layers, but not limited thereto. More specifically, the substrate 12 is preferably a P− semiconductor layer, the first semiconductor layer 18 is a N+ semiconductor layer, the second semiconductor layer 20 is a P− semiconductor layer, the third semiconductor layer 22 is a N− semiconductor layer, and the fourth semiconductor layer 24 is a P+ semiconductor layer.

It should be noted that the first semiconductor layer 18, the second semiconductor layer 20, the third semiconductor layer 22, and the fourth semiconductor layer 24 in this embodiment are all made of silicon and formed on the substrate 12 through epitaxial growth process, in which different type of dopants were implanted through ion implant process into the first semiconductor layer 18 and the fourth semiconductor layer 24 during the deposition of these two layers 18 and 24 to form. N+ semiconductor layer and P+ semiconductor layer respectively. The second semiconductor layer 20 and third semiconductor layer 22 on the other hand are formed by epitaxial growth process accompanied by in-situ doping process to form a P+ semiconductor layer and a N− semiconductor layer.

Next, thyristors 26 are formed on the cell region 14. In this embodiment, the formation of the thyristors 26 could be accomplished by first conducting a photo-etching process to remove part of the fourth semiconductor layer 24, part of the third semiconductor layer 22, part of the second semiconductor layer 20, and part of the first semiconductor layer 18 on the cell region 14 to form trenches 28, in which the bottom of the trenches 28 are inserted into part of the first semiconductor layer 18. Next, a metal layer is deposited into the trenches 28 and an etching back process is conducted to remove part of the metal layer in the trenches 28 so that the top surface of the remaining metal layer is slightly lower than the top surface of the first semiconductor layer 18. This formed patterned metal layers 30 and patterned metal layer 32 on the cell region 14, in which the patterned metal layer 32 being the patterned metal layer closest to a region between cell region 14 and peripheral region 16. Preferably, the patterned metal layers 30, 32 could include Al, Cr, Cu, Ta, Mo, W, or combination thereof.

Next, a dielectric layer is formed to fill the trenches 28, and a planarizing process such as chemical mechanical polishing (CMP) is conducted to remove part of the dielectric layer so that the top surface of the remaining dielectric layer is even with the top surface of the fourth semiconductor layer 24. This forms vertical dielectric patterns 34, 36, in which the vertical dielectric pattern 36 being the pattern closest to the junction region between cell region 14 and peripheral region 16. Preferably, the dielectric layer or vertical dielectric patterns 34, 36 are made of silicon oxide, but could also include other dielectric material such as but not limited to for example SiN, SiON, or SiCN.

Next, a photo-etching process is conducted to remove part of the fourth semiconductor layer 24, part of the third semiconductor layer 22, part of the second semiconductor layer 20, part of the first semiconductor layer 18, and part of the substrate 12 on the intersecting or junction region between cell region 14 and peripheral region 16 for forming a trench (not shown), and a dielectric material is deposited into the trench to form a first shallow trench isolation (STI) 38 on the junction region between the cell region 14 and peripheral region 16. It should be noted that even though the target of the photo-etching process at this stage is the four semiconductor layers and part of the substrate 12 adjacent to the vertical dielectric pattern 36, it would also be desirable to remove part of the vertical dielectric pattern 36 and part of the patterned metal layer 32 while part of the four semiconductor layers 18, 20, 22, 24 and part of the substrate 12 are removed, which is also within the scope of the present invention. In this embodiment, the first STI 38 and the vertical dielectric pattern 36 could include same material or different material, in which the two elements 36 and 38 are preferably made of silicon oxide but could also include other dielectric material such as but not limited to for example SiN, SiON, SiCN, or combination thereof depending on the demand of the product.

Figure 2:
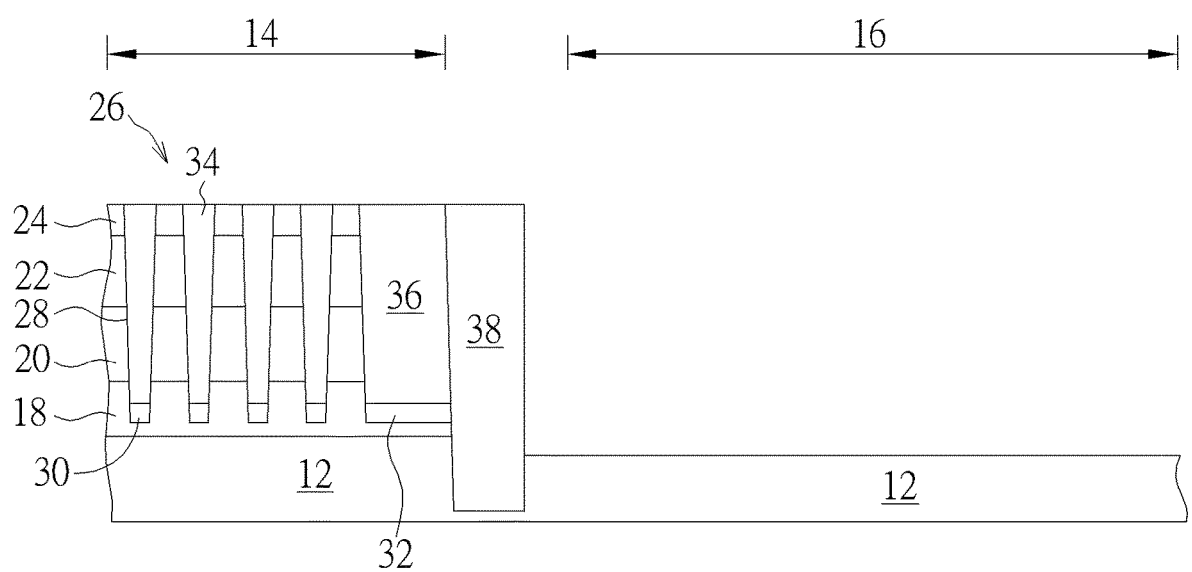

Next, as shown in FIG. 2, a photo-etching process is conducted to remove the fourth semiconductor layer 24, the third semiconductor layer 22, the second semiconductor layer 20, the first semiconductor layer 18, and even part of the substrate 12 on the peripheral region 16 so that the substrate 12 on the peripheral region 16 is exposed and the surface of the substrate 12 is slightly lower than the surface of the substrate 12 on the cell region 14. It should be noted that even though part of the substrate 12 is removed during the removal of the four semiconductor layers 18, 20, 22, 24, it would also be desirable to only remove the four semiconductor layers 18, 20, 22, 24 and stop on the surface of the substrate 12 so that the substrate 12 surface on the peripheral region 16 is even with the substrate 12 surface on the cell region 14 before conducting the follow-up process, which is also within the scope of the present invention.

Figure 3:
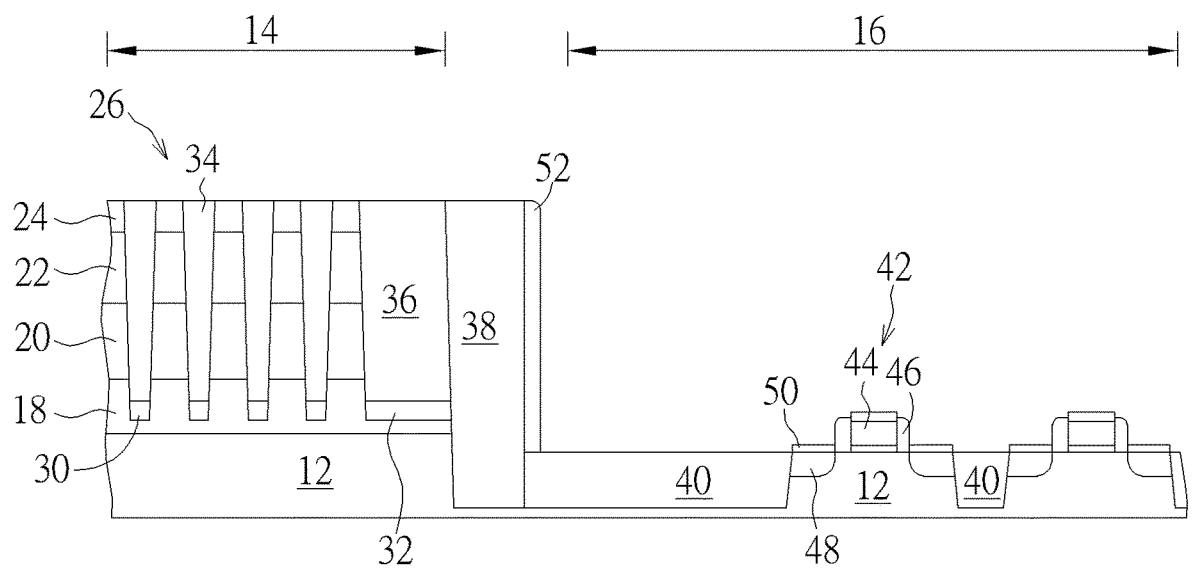

Next, as shown in FIG. 3, part of the substrate 12 on the peripheral region 16 is removed to form openings or trenches (not shown) to define the active region for the MOS transistor formed thereafter, and a dielectric material is deposited into the openings to form second STI 40 surrounding the substrate 12 on the peripheral region 16. In this embodiment, the first STI 38 and the second STI 40 could include same material such as silicon oxide, but not limited thereto.

It should be noted that even though part of the substrate 12 on peripheral region 16 is removed to form the second STI 40 after forming the thyristors 26 on the cell region 14, it would also be desirable to first remove part of the substrate 12 on peripheral region 16 to form the second STI 40 and then form the first semiconductor layer 18, second semiconductor layer 20, third semiconductor layer 22, and fourth semiconductor layer 24 on both cell region 14 and peripheral region 16 before conducting the process as disclosed in FIG. 1, which is also within the scope of the present invention.

In other words, if the thyristors 26 were formed before forming the second STI 40 on the peripheral region 16, the substrate 12 on the peripheral region 16 would be slightly lower than the surface of the substrate 12 on the cell region 14. However, if the second STI 40 were form on the peripheral region 16 before forming the thyristors 26 on the cell region 14, the top surfaces of the substrate 12 and second STI 40 on the peripheral region 16 would be even with the surface of the substrate on cell region 14. These two approaches are all within the scope of the present invention.

Next, MOS transistors 42 are formed on the substrate 12 on peripheral region 16. In this embodiment, the formation of the MOS transistor 42 could be accomplished by first forming at least a gate structure 44 on the substrate 12 on peripheral region 16, forming a first spacer 46 around the gate structure 44, forming a source/drain region 48 in the substrate 12 adjacent to two sides of the first spacer 46, and then conducting a salicide process to form silicide layers 50 on the source/drain region 48 adjacent to two sides of the first spacer 46. It should be noted that the formation of the first spacer 46 is accomplished by first depositing a dielectric layer made of material such as silicon nitride on the substrate 12 to cover the gate structure 44 as well as the sidewall of the first STI 38, and then conducting an etching process to remove part of the dielectric layer to form the first spacer 46 and a second spacer 52 on the sidewall of the first STI 38. In this embodiment, each of the first spacer 46 and the second spacer 52 could be a single spacer or a composite spacer, such as a spacer including but not limited to for example an offset spacer (not shown) and a main spacer (not shown). Preferably, the offset spacer and the main spacer could include same material or different material while both the offset spacer and the main spacer could be made of material including but not limited to for example $SiO_2$, SiN, SiON, SiCN, or combination thereof.

Figure 4:
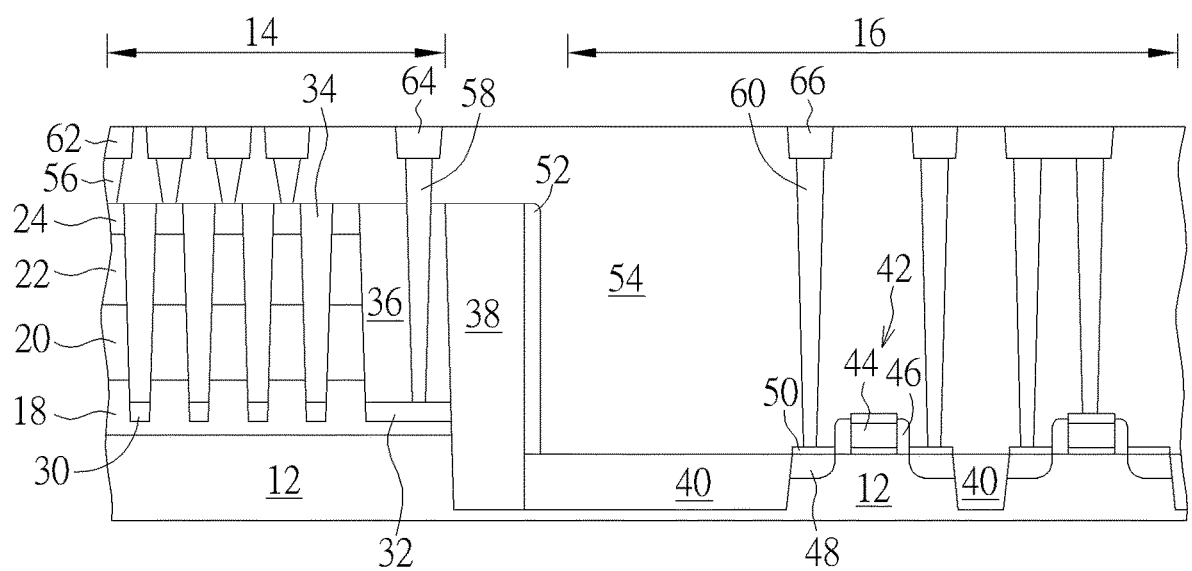

Next, as shown in FIG. 4, an interlayer dielectric (ILD) layer 54 is formed on the substrate 12 to cover the fourth semiconductor layer 24 on the cell region 14, the first STI 38, and the MOS transistors 42 on the peripheral region 16, and a contact plug formation and metal interconnect process are conducted to form contact plugs 56, 58, 60 and metal interconnects 62, 64, 66 in the ILD layer 54 on both cell region 14 and peripheral region 16. Specifically, the contact plug formation and metal interconnect process are conducted to form metal interconnect 62 and contact plug 56 connecting the fourth semiconductor layer 24 and metal interconnect 64 and contact plug penetrating through the vertical dielectric pattern 36 and connecting the patterned metal layer 32 in the first semiconductor layer 18 on cell region, and at the same time form the metal interconnect 66 and contact plug 60 connecting the silicide layers 50 and/or source/drain region 48 on the peripheral region 16. In this embodiment, the ILD layer 54 could include oxides including but not limited to for example tetraethyl orthosilicate (TEOS), the metal interconnects 62, 64, 66 could include Al, Cr, Cu, Mo, W, or combination thereof, and the contact plugs 56, 58, 60 could include W, but not limited thereto.

Figure 5:
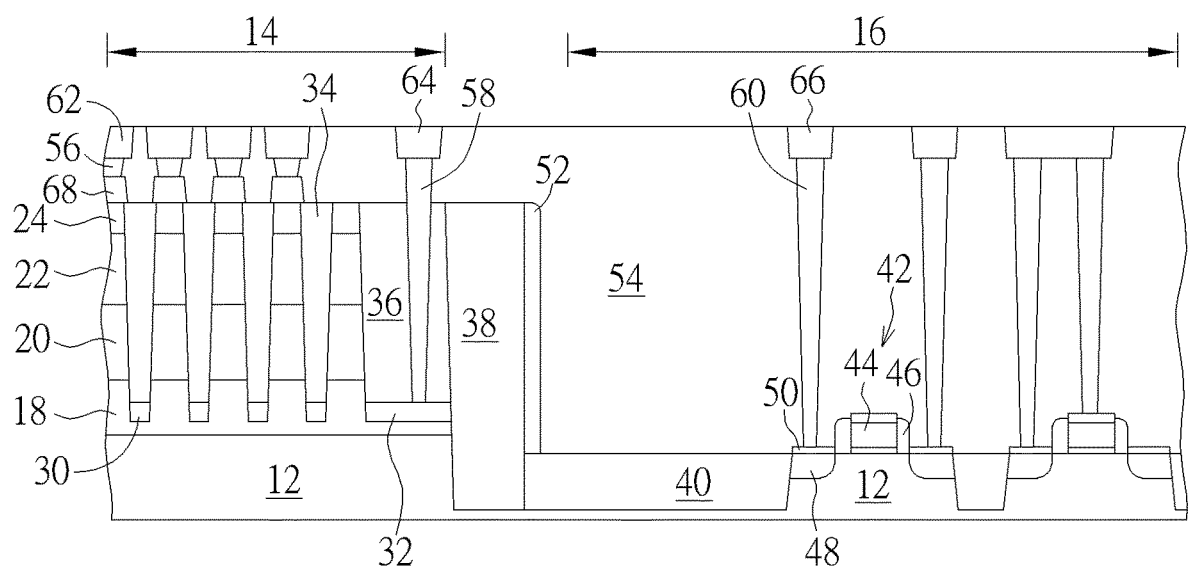
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, in contrast to the contact plug 56 in FIG. 4 contacting the fourth semiconductor layer 24 directly, it would also be desirable to incorporate a silicide process with the contact formation process so that silicide layers 68 could be formed between the contact plugs 56 and the fourth semiconductor layer 24, which is also within the scope of the present invention.

Figure 6:
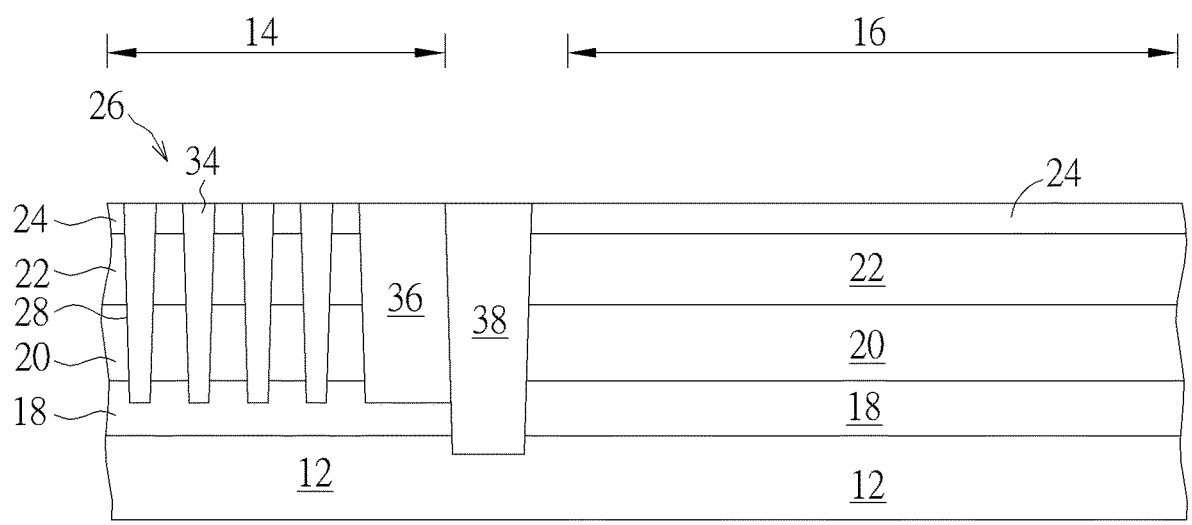
FIGS. 6-9 illustrate a method for fabricating a semiconductor device according to a second embodiment of the present invention.

Referring to FIGS. 6-9, FIGS. 6-9 illustrate a method for fabricating a semiconductor device according to a second embodiment of the present invention. It should be noted that for simplicity purpose, same elements from FIGS. 1-4 and 6-9 are labeled with same numberings. As shown in FIG. 6, similar process shown in FIG. 1 is conducted by forming a first semiconductor layer 18, a second semiconductor layer 20, a third semiconductor layer 22, and a fourth semiconductor layer 24 on the substrate 12 on both cell region 14 and peripheral region 16, forming thyristors 26 and vertical dielectric patterns 34, 36 on the cell region 14, and then forming a first STI 38 extending into the substrate 12 between the cell region 14 and the peripheral region 16.

It should be noted that in contrast to the aforementioned embodiment of forming patterned metal layers in the first semiconductor layer 18 of each thyristor 26, no patterned metal layer is formed prior to the formation of the trenches 28 in the first semiconductor layer 18, second semiconductor layer 20, third semiconductor layer 22, and fourth semiconductor layer 24 so that the top surface of the dielectric layer or vertical dielectric patterns 34, 36 within the trenches is even with the top surface of the fourth semiconductor layer 24 while the bottom of the vertical dielectric patterns 34, 36 is inserted into part of the first semiconductor layer 18.

Figure 7:
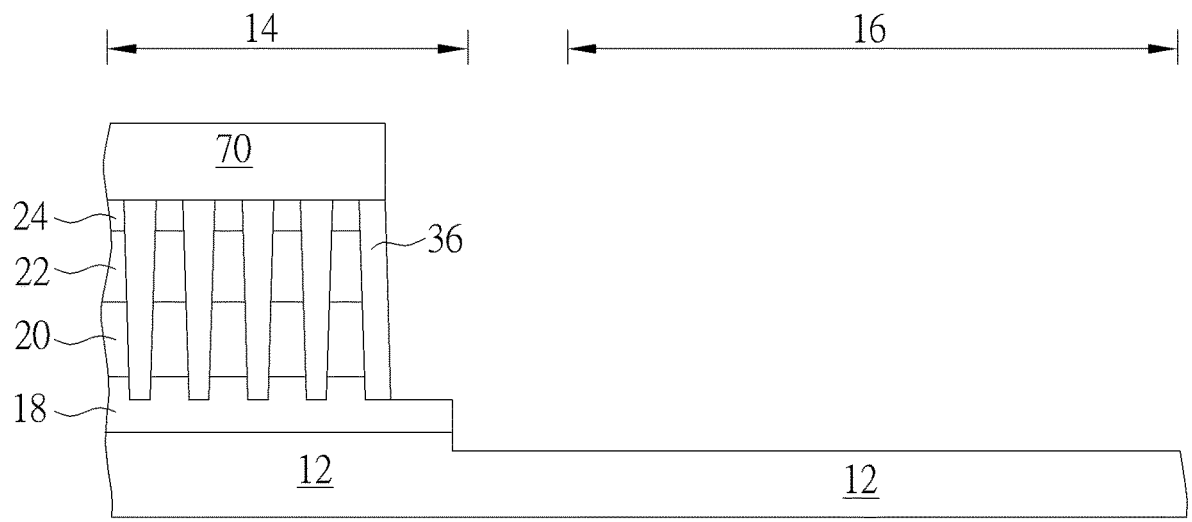

Next, as shown in FIG. 7, a patterned mask 70, such as a patterned resist is formed on the cell region 14, and an etching process is conducted by using the patterned mask 70 to remove the first semiconductor layer 18, the second semiconductor layer 20, the third semiconductor layer 22, the fourth semiconductor layer 24, and part of the substrate 12 on the peripheral region 16, part of vertical dielectric pattern 36 on the cell region 14, and the first STI 38 between the cell region 14 and the peripheral region 16. This exposes the top surface and sidewalls of the first semiconductor layer 18 on cell region 14 and the substrate 12 on peripheral region 16 while the sidewalls of the second semiconductor layer 20, the third semiconductor layer 22, and the fourth semiconductor layer 24 are covered by the remaining vertical dielectric pattern 36. The patterned mask 70 is removed thereafter.

Figure 8:
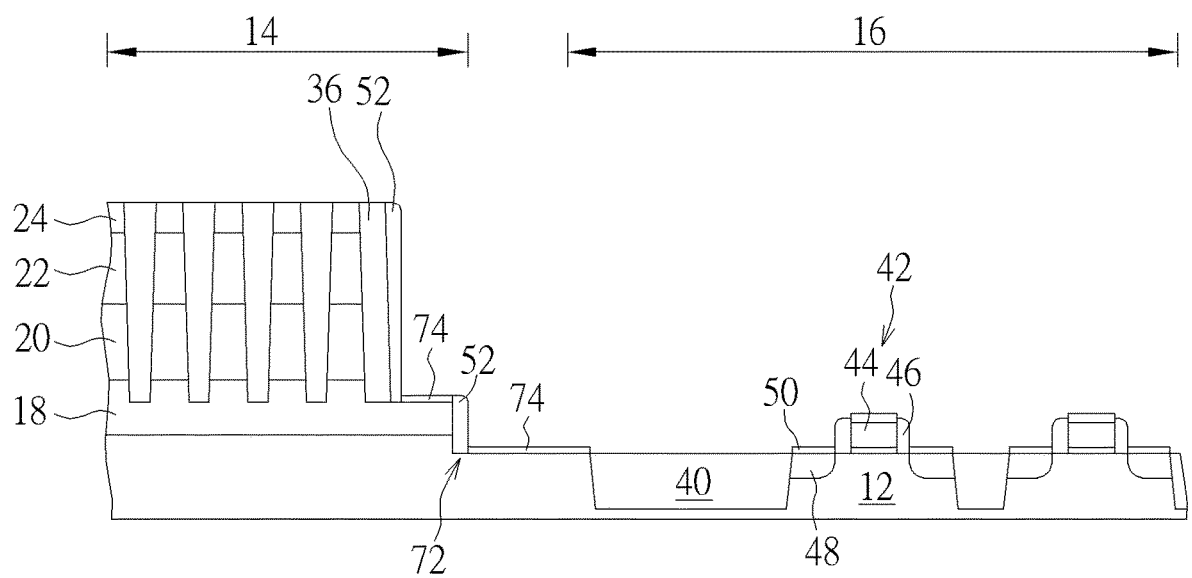

Next, as shown in FIG. 8, another photo-etching process is conducted to remove part of the substrate 12 on the peripheral region 16 to form trenches to define the active region for the MOS transistor formed thereafter, and a dielectric material is deposited into the openings to form second STI 40 surrounding the substrate 12 on the peripheral region 16. In this embodiment, the first STI 38 and the second STI 40 could include same material such as silicon oxide, but not limited thereto.

Similar to the aforementioned embodiment, even though part of the substrate 12 on peripheral region 16 is removed to form the second STI 40 after forming the thyristors 26 on the cell region 14, it would also be desirable to first remove part of the substrate 12 on peripheral region 16 to form the second STI 40 and then form the first semiconductor layer 18, second semiconductor layer 20, third semiconductor layer 22, and fourth semiconductor layer 24 on both cell region 14 and peripheral region 16 before conducting the process as disclosed in FIG. 6, which is also within the scope of the present invention.

Moreover, since the first STI 38 is completely removed before forming the second STI 40, the surface of the substrate 12 between the cell region 14 and peripheral region 16 would reveal two different heights to form a step 72 after the second STI 40 is formed, in which the top surface of the lower substrate 12 is substantially even with the top surface of the substrate 12 on the peripheral region 16.

Next, MOS transistors 42 are formed on the substrate 12 on peripheral region 16. In this embodiment, the formation of the MOS transistor 42 could be accomplished by first forming at least a gate structure 44 on the substrate 12 on peripheral region 16, forming a first spacer 46 around the gate structure 44, forming a source/drain region 48 in the substrate 12 adjacent to two sides of the first spacer 46, and then conducting a salicide process to form silicide layers 50 on the source/drain region 48 adjacent to two sides of the first spacer 46.

It should be noted that since the first STI 38 between the cell region 14 and peripheral region 16 is completely removed prior to the formation of MOS transistors 42, second spacers 52 are preferably formed on the sidewalls of the first semiconductor layer 18, substrate 12, and vertical dielectric pattern 36 on the cell region 14 while the first spacer 46 is formed on the sidewall of the gate structure 44. Moreover, silicide layers 74 are also formed on the exposed top surface of the first semiconductor layer 18 and substrate 12 on cell region 14 when silicide layers 50 are formed adjacent to two sides of the first spacer 46.

Similarly, each of the first spacer 46 and the second spacer 52 could be a single spacer or a composite spacer, such as a spacer including but not limited to for example an offset spacer (not shown) and a main spacer (not shown). Preferably, the offset spacer and the main spacer could include same material or different material while both the offset spacer and the main spacer could be made of material including but not limited to for example SiO$_2$, SiN, SiON, SiCN, or combination thereof.

Figure 9:
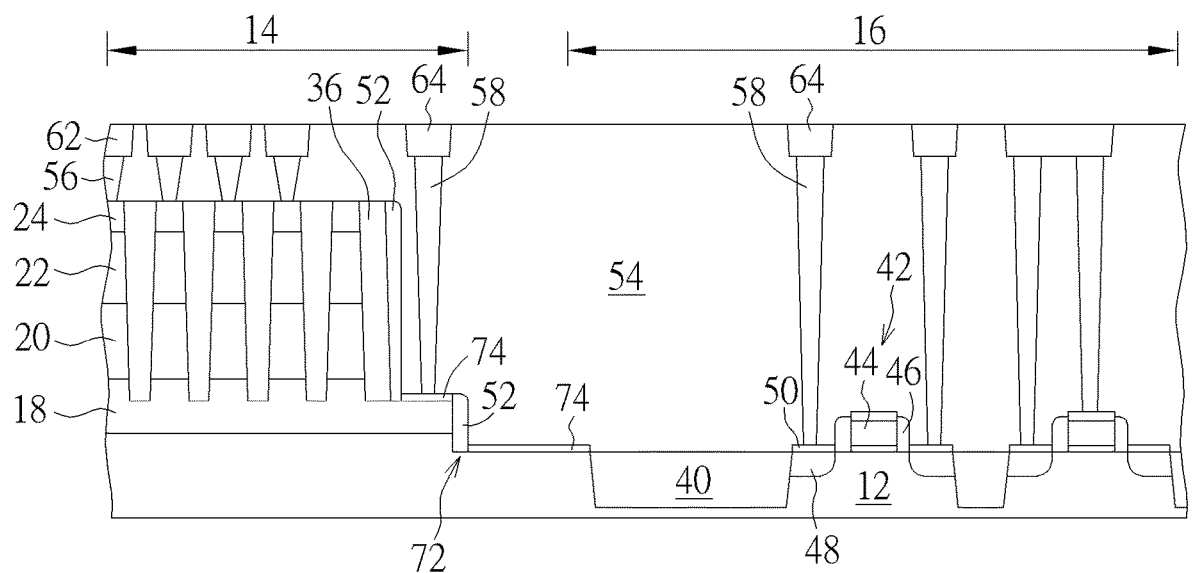

Next, as shown in FIG. 9, an interlayer dielectric (ILD) layer 54 is formed on the substrate 12 to cover the fourth semiconductor layer 24 on the cell region 14, the first STI 38, and the MOS transistors 42 on the peripheral region 16, and a contact plug formation and metal interconnect process are conducted to form contact plugs 56, 58, 60 and metal interconnects 62, 64, 66 in the ILD layer 54 on both cell region 14 and peripheral region 16. Specifically, the contact plug formation and metal interconnect process are conducted to form metal interconnect 62 and contact plug 56 connecting the fourth semiconductor layer 24 and metal interconnect 64 and contact plug 58 connecting the silicide layer 74 on the first semiconductor layer 18 on cell region 14, and at the same time form the metal interconnect 66 and contact plug 60 connecting the silicide layers 50 and/or source/drain region 48 on the peripheral region 16. In this embodiment, the ILD layer 54 could include oxides including but not limited to for example tetraethyl orthosilicate (TEOS), the metal interconnects 62, 64, 66 include Al, Cr, Cu, Mo, W, or combination thereof, and the contact plugs 56, 58, 60 preferably include W, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a cell region and a peripheral region,
   a thyristor on the cell region, wherein
   the thyristor comprises a first semiconductor layer, a second semiconductor layer, a third semiconductor layer, and a fourth semiconductor layer on the cell region;
   a Metal Oxide Semiconductor (MOS) transistor on the peripheral region;
   a first silicide layer on the substrate adjacent to the thyristor on the cell region; and
   wherein a first step is formed in the cell region from an upper surface of the fourth semiconductor layer down to an upper surface of the first semiconductor layer,
   a second step is formed in the cell region from the upper surface of the first semiconductor layer down to an upper surface of the substrate,
   a portion of the second step extends in a first direction between the cell region and the peripheral region.

2. The semiconductor device of claim 1, wherein the thyristor further comprises:
   vertical dielectric patterns in the first semiconductor layer, the second semiconductor layer, the third semiconductor layer, and the fourth semiconductor layer; and
   first contact plugs on the fourth semiconductor layer.

3. The semiconductor device of claim 2, further comprising an interlayer dielectric (ILD) layer around the thyristor and the MOS transistor, wherein top surfaces of the first contact plugs and the ILD layer are coplanar.

4. The semiconductor device of claim 2, further comprising a first spacer on a sidewall of the vertical dielectric patterns, wherein a top surface of the first spacer is even with a top surface of the vertical dielectric patterns.

5. The semiconductor device of claim 4, wherein the first silicide layer contacts the first spacer directly.

6. The semiconductor device of claim 4, further comprising a second spacer on a sidewall of the second step.

7. The semiconductor device of claim 6, wherein the second spacer contacts the first silicide layer directly.

8. The semiconductor device of claim 6, further comprising a second silicide layer between the MOS transistor and the second spacer.

9. The semiconductor device of claim 8, further comprising a shallow trench isolation (STI) between the MOS transistor and the second silicide layer.

10. The semiconductor device of claim 9, wherein the MOS transistor comprises:
    a gate structure on the substrate on the peripheral region;
    a third spacer around the gate structure;
    a third silicide layer adjacent to two sides of the third spacer; and
    a second contact plug on the third silicide layer.

11. The semiconductor device of claim 10, further comprising an interlayer dielectric (ILD) layer around the thyristor and the MOS transistor, wherein top surfaces of the second contact plug and the ILD layer are coplanar.

\* \* \* \* \*